United States Patent
Harris et al.

(10) Patent No.: US 6,406,540 B1
(45) Date of Patent: *Jun. 18, 2002

(54) PROCESS AND APPARATUS FOR THE GROWTH OF NITRIDE MATERIALS

(75) Inventors: Meckie T. Harris, Nashua, NH (US); Michael J. Suscavage, Shirley; David F. Bliss, Arlington, both of MA (US); John S. Bailey; Michael Callahan, both of Temple, NH (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/299,928

(22) Filed: Apr. 27, 1999

(51) Int. Cl.$^7$ ............................................. C30B 23/06
(52) U.S. Cl. .................. 117/104; 117/952; 204/298.39; 204/298.12; 427/255.39; 427/255.394
(58) Field of Search ...................... 427/255.39, 255.394; 204/298.13, 298.12; 117/952, 104

(56) References Cited

U.S. PATENT DOCUMENTS

| 3,959,446 A | * | 5/1976 | Mazdiyasni et al. | ........ 423/344 |
| 4,144,116 A | | 3/1979 | Jacob et al. | |
| 6,113,985 A | * | 9/2000 | Suscavage et al. | .... 427/255.39 |

FOREIGN PATENT DOCUMENTS

| JP | 04-321503 | * | 3/1986 | ................. 117/952 |
| JP | 61-44701 | * | 3/1986 | ................. 117/952 |

OTHER PUBLICATIONS

Sylwester Porowski, Bulk and Homoepitaxial GaN–growth and characterisation, Journal and Crystal Growth, 1998, 153–158, 189/190, Elsevier Science B.V., Warsaw, Poland.

(List continued on next page.)

*Primary Examiner*—Robert Kunemund
(74) *Attorney, Agent, or Firm*—Thomas C. Stover

(57) ABSTRACT

This invention provides a process and apparatus for producing products of M-nitride materials wherein M=gallium (GaN), aluminum (AlN), indium (InN), germanium (GeN), zinc (ZnN) and ternary nitrides and alloys such as zinc germanium nitride or indium aluminum gallium nitride. This process and apparatus produce either free-standing single crystals, or deposit layers on a substrate by epitaxial growth or polycrystalline deposition. Also high purity M-nitride powders may be synthesized. The process uses an ammonium halide such as ammonium chloride, ammonium bromide or ammonium iodide and a metal to combine to form the M-nitride which deposits in a cooler region downstream from and/or immediately adjacent to the reaction area. High purity M-nitride can be nucleated from the vapor to form single crystals or deposited on a suitable substrate as a high density material. High purity M-nitride single crystals can be grown by the direct reaction of the halide with the M-metal in a range of sizes from a few micrometers to centimeters, depending on the growth conditions. The small sized crystals are recovered as high purity M-nitride powder while the larger crystals can be prepared as substrates for electronic devices or UV/blue/green emitting diodes and lasers. The deposited layers can be used as M-nitride substrates, or targets for pulsed laser deposition (PLD), or other systems requiring high density targets. The deposition process, and subsequent density of the resulting component, is controlled by the reaction medium and by adjusting the temperature of the ammonium halide in an area near but separate from the reaction zone. Thickness of deposition on the substrates by the same process involves placement of the substrates in a suitable area in the reaction chamber and may be further controlled by the use of nitrogen, nitrogen-hydrogen mixtures or other suitable controlling gas to facilitate uniform distribution of the layer.

19 Claims, 3 Drawing Sheets

OTHER PUBLICATIONS

Y. Naoi*.K.Kobatake, S. Kurai, K. Nishino, H. Sato, M. Nozaki, S.Sakai, Y. Shintani, Characterization of bulk GaN grown by sublimation technique, Journal of Crystal Growth, 1998, 163–166, 189/190, Elsevier Science B.V., Warshaw, Poland.

R.J. Molnar, P.Maki, R. Aggarwal, Z.L. Liau, E.R. Brown, I. Melngailis W. Gotz, L.T. Romano, N.M. Johnson, Gallium Nitride Thick Films Grown by Hydride Vapor Phase Epitaxy, Symposium E "III–Nitride, SiC and Diamond for Electronic Devices", 1996, vol. 423, Mater. Soc. Symp. Proc., USA.

Glen A. Slack, T.F. McNelly, Growth of HIgh Purity AIN Crystals, Journal of Crystal Growth, 1976, 263–279, 34, North–Holland Publishing Company.

T. Detchprohm, K.Hiramatsu, N. Sawaki, I. Akasaki, The homoepitaxy of GaN by metalorganic vapor phase epitxy using GaN substrates, Journal of Crystal Growth, 1994, 170–174, 137, Elsevier.

Takao Ishii, Yasuo Tazoh, Shinataro Miyazawa, LiGaO2 single crystal as a lattice–matched substrate for hexagonal GaN thin films, Journal of Crystal Growth, 1998, 208–212, 189/190, Elsevier Science, B.V.

H.P. Maruska,J.J. Tietjen, The Preparation and Properties of Vapor–Deposited Single Crystal–Line GaN, Applied Physics Letters, Nov. 15, 1969, 327–329, vol. 15 No. 10.

* cited by examiner

PROCESS AND APPARATUS FOR THE GROWTH OF NITRIDE MATERIALS

STATEMENT REGARDING FEDERALLY SPONSORED RESEARCH OR DEVELOPMENT

The invention described herein may be manufactured and used by or for the Government for governmental purposes without the payment of any royalty thereon.

CROSS-REFERENCES TO RELATED PATENT APPLICATIONS

None.

BACKGROUND OF THE INVENTION

The present invention relates to semiconductor materials, and, in particular, relates to nitride materials, and more particularly relates to GaN.

The current substrates of choice for M-nitride electronic components are sapphire, lithium gallium oxide, silicon carbide or zinc oxide. M represents gallium, aluminum, indium, germanium, zinc and ternary combinations and alloys of the above such as zinc germanium and indium aluminum gallium. Sapphire is low in cost but has a lattice mismatch exceeding 12%. Lithium gallium oxide has a thermal expansion mismatch, crystal twinning problems, and the possibility of contaminating deposited films when used as a substrate. Silicon carbide has a close lattice match with the nitrides but it is expensive. The fact that SiC has a different crystal structure from the wurtzite crystal structure of the nitrides is believed to cause stacking faults in deposited films. Zinc oxide has the same wurtzite crystal structure as the metal nitrides but is also very expensive. Its limitation for use as a substrate is the inability to sustain high temperatures and its reaction with HCl and organometallics currently used in most deposition processes.

In the absence of methods for producing large metal nitride single crystals, growth of thick metal nitride films on alternative substrates (hetero-epitaxy) has been attempted as a means of producing large area substrates. A number of innovative schemes have been developed to overcome strain problems with thick epitaxial M-nitride layers ("Gallium Nitride Thick Films Grown by Hydride Vapor Phase Epitaxy", by R. J. Molnar et al., *Proceedings, 1996 MRS Spring Meeting*). However, additional expensive engineering steps required to grow adequate films for electronic devices make these processes undesirable.

The ideal choice for M-nitride epitaxy would be a substrate of the same material (homo-epitaxy) with an exact match of lattice parameter, crystal structure and thermal expansion coefficient. For this purpose, bulk growth of M-nitride material is intrinsically the most desirable approach to creating M-nitride substrates. Currently the only bulk growth of the nitride materials involves a very high pressure, (exceeding 20,000 atmospheres) and high temperature (above 1400° C.) reaction of nitrogen and the metal of choice, which makes this a non-viable commercial process ("The Homoepitaxy of GaN by Metalorganic Vapor Phase Epitaxy using GaN Substrates", by T. Detchprohm et al., Journal of Crystal Growth 137 (1994) 170). A similar system was employed for growth of A/N crystals using high pressure (Growth of High Purity A/N Crystals", by G. Slack et. al., Journal of Crystal Growth 34 (1976) 263). This is also a non-viable commercial process.

BRIEF SUMMARY OF THE INVENTION

This invention provides a process and apparatus for producing products of M-nitride materials wherein M=gallium (GaN), aluminum (A/N), indium (InN), germanium (GeN), zinc (ZnN) and ternary nitrides and alloys such as zinc germanium nitride or indium aluminum gallium nitride. This process and apparatus produce either free-standing single crystals, or deposit layers on a substrate by epitaxial growth or polycrystalline deposition. Also high purity M-nitride powders may be synthesized.

The process uses an ammonium halide such as ammonium chloride, ammonium bromide or ammonium iodide and a metal to combine to form the M-nitride which deposits in a cooler region downstream from and/or immediately adjacent to the reaction area. High purity M-nitride can be nucleated from the vapor to form single crystals or deposited on a suitable substrate as a high density material. High purity M-nitride single crystals can be grown by the direct reaction of the halide with the M-metal in a range of sizes from a few micrometers to centimeters, depending on the growth conditions. The small sized crystals are recovered as high purity M-nitride powder while the larger crystals can be prepared as substrates for electronic devices or UV/blue/green emitting diodes and lasers. The deposited layers can be used as M-nitride substrates, or targets for pulsed laser deposition (PLD), or other systems requiring high density targets. The deposition process, and subsequent density of the resulting component, is controlled by the reaction medium and by adjusting the temperature of the ammonium halide in an area near but separate from the reaction zone. Thickness of deposition on the substrates by the same process involves placement of the substrates in a suitable area in the reaction chamber and may be further controlled by the use of nitrogen, nitrogen-hydrogen mixtures or other suitable controlling gas to facilitate uniform distribution of the layer.

Therefore, one object of the present invention is to provide an apparatus and process for producing products of M-nitride materials.

Another object of the present invention is to provide an apparatus and process for producing products of GaN.

Another object of the present invention is to provide an apparatus and process for producing products of M-nitride materials with variable reactor conditions from low pressures to above atmospheric and temperature ranges from a few hundred degrees centigrade to well over one thousand degrees centigrade.

Another object of the present invention is to provide an apparatus and process for producing products of M-nitride materials such as free-standing single crystals and layers on a substrate.

Another object of the present invention is to provide an apparatus and process for producing products of M-nitrides such as free-standing single crystals and layers on a substrate including powders thereof.

Another object of the present invention is to provide an apparatus and process for producing products of M-nitride materials for use as UV/blue/green LEDs, lasers and UV detectors, for example.

Another object of the present invention is to provide an apparatus and process for producing products of M-nitride materials which use an ammonium halide and a metal to combine to form the materials of interest.

Another object of the present invention is to provide an apparatus and process for producing products of M-nitride materials such as small single crystals for use as powders, large single crystals for use as component substrates, deposited layers for use as M-nitride substrates, targets for pulsed laser deposition, or other processes requiring high density materials with low $O_2$ content.

These and many other objects and advantages of the present invention will be readily apparent to one skilled in the pertinent art from the following detailed description of a preferred embodiment of the invention and the related drawings.

DETAILED DESCRIPTION OF THE INVENTION

Figure 1:
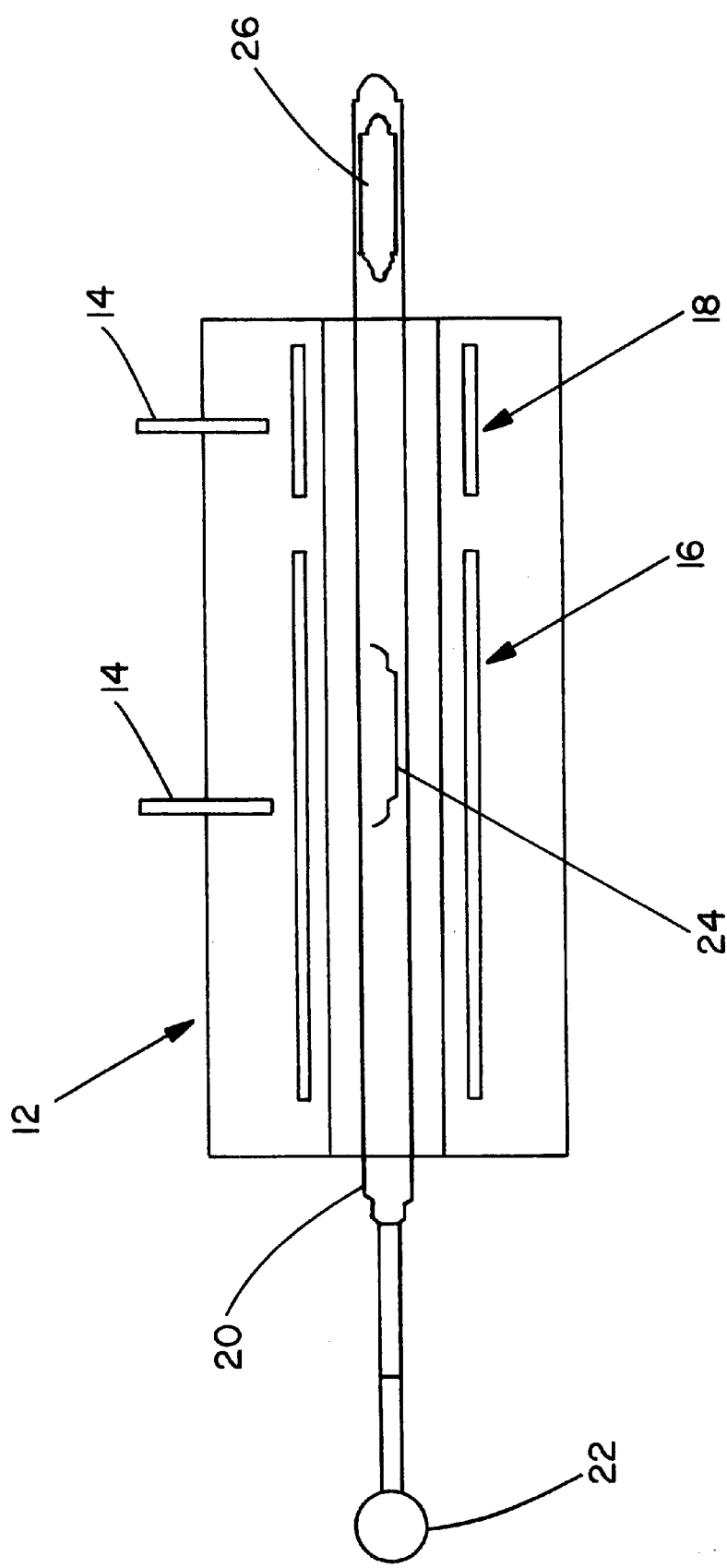
FIG. 1 illustrates by partial schematic a device for the forming of M-nitride material wherein the ammonium chloride is heated by the same furnace as the M-metal.

This invention relates to a novel method for the synthesis and crystal growth of M-nitride materials, where M=gallium (e.g., GaN), aluminum (A/N), indium (InN), germanium (GeN) and ternary combinations and alloys of the above such as zinc germanium nitride or indium aluminum gallium nitride. An improved method for synthesis of these materials is needed for high purity powders and high density targets for systems such as low energy sputter deposition or pulsed laser deposition (PLD). In addition, single crystal growth of the nitrides is necessary to produce both substrates and epitaxial thin films for high temperature electronic devices, blue emitters, and blue lasers.

The process uses a first reactant of ammonium halide such as ammonium chloride, ammonium bromide, or ammonium iodide to react with the desired metal to create the semiconductor nitride. In the current embodiments of the invention, ammonium halide vapor reacts with a metal in a flow tube to form M-nitride, which deposits in a cooler region downstream in the chamber and/or immediately adjacent to the reaction area. For example, the reaction between ammonium chloride with gallium occurs in the following manner:

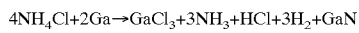

$$4NH_4Cl + 2Ga \rightarrow GaCl_3 + 3NH_3 + HCl + 3H_2 + GaN$$

and further,

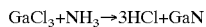

$$GaCl_3 + NH_3 \rightarrow 3HCl + GaN$$

Since the reaction may liberate a large quantity of hydrogen gas and/or HCl gas, the first system may be designed with an apparatus to allow passage of gaseous components out of the system. The reaction temperature is typically in the range of 600° C. to 900° C., whereas the volatilization temperature of ammonium chloride is >200° C. A steep temperature gradient is maintained between the chloride region and the metal source region. The furnace design incorporates the capability to maintain the halide and the metal at two separate temperature zones. In the lower temperature zone, the solid reactant is vaporized and transported toward the molten metal. The reaction occurs in the higher temperature zone, where the metal reacts with the halide, producing the desired M-nitride and various by-products.

For synthesizing high purity M-nitride in the reaction chamber the reaction products are recovered as high purity M-nitride powder or high density material deposited on a suitable substrate. Deposition of the M-nitride on the substrates involves placement of the substrates in a suitable area in the reaction chamber, either for single crystal thin film growth or for thick polycrystalline layer growth. After deposition is complete, the resulting M-nitride single crystal films can be used as substrates for electronic devices. Thick polycrystalline layers can be used as targets for pulsed laser deposition (PLD), for sputtering targets, or for other systems requiring high density targets.

The deposition rate and subsequent density of the resulting component is controlled by adjusting the temperature of the ammonium halide in an area near but separate from the reaction zone. The concentration and distribution of gaseous ammonium halide may be further controlled by the use of nitrogen, nitrogen/hydrogen mixtures, or other suitable carrier gases to facilitate the uniform deposition of the layer. Additional gases for doping or modifying the III/V ratio may also be added.

For producing bulk single crystals of M-nitride, this process involves the production of M-nitride single crystals by the direct reaction of molten metal with the reaction agent. Single crystals are formed on the top surface of the molten metal forming a bridge across the top of the metal source boat. These crystals increase in size as the molten metal continues to react with the halide vapor. Large single crystals of M-nitride are suitable as substrates for high temperature electronic materials, for blue emitters and blue lasers.

In this process ammonium chloride is reacted with the metals of choice under conditions favorable for converting the metal into the metal nitride. The chamber where the metal/ammonium chloride reaction takes place is located separate from the solid ammonium chloride containment area. Temperature control of the ammonium chloride containment area is necessary to control the rate of reaction. Several embodiments of the process using different methods for control of the ammonium chloride volatilization are suggested, but not limited to, as follows:

1. Referring to FIG. 1, by transverse movement of a container vessel 20 which contains a reaction chamber and ammonium chloride containing area through a furnace 12 operating at a temperature sufficient to react the ammonium chloride vapor with the molten metal, X. Ammonium chloride solid (below 340°) is initially placed outside the furnace or positioned such that the ammonium chloride is below the sublimation temperature. The reaction container 20 vessel is slowly pulled through the furnace 12 where the ammonium chloride charge in the ammonium chloride source 26 is slowly brought above or near the sublimation temperature by a first heating zone 18. The ammonium chloride vapor flows over the metal charge in a metal source zone 24 where its reaction forms the M-nitride material. The by-products of the reaction, hydrogen and/or HCl, pass out of the reaction container through an expandable flexible membrane 22 which has small holes in it. The holes are put in the membrane during the initial furnace heat-up. This allows the expanding gas to inflate the membrane, allowing the hydrogen and HCl to escape, thus preventing an explosion, while eliminating any back-diffusion of oxygen and water vapor from the atmosphere. A plurality of thermocouples 14 monitor the heatings zones 16 and 18.

Figure 2:
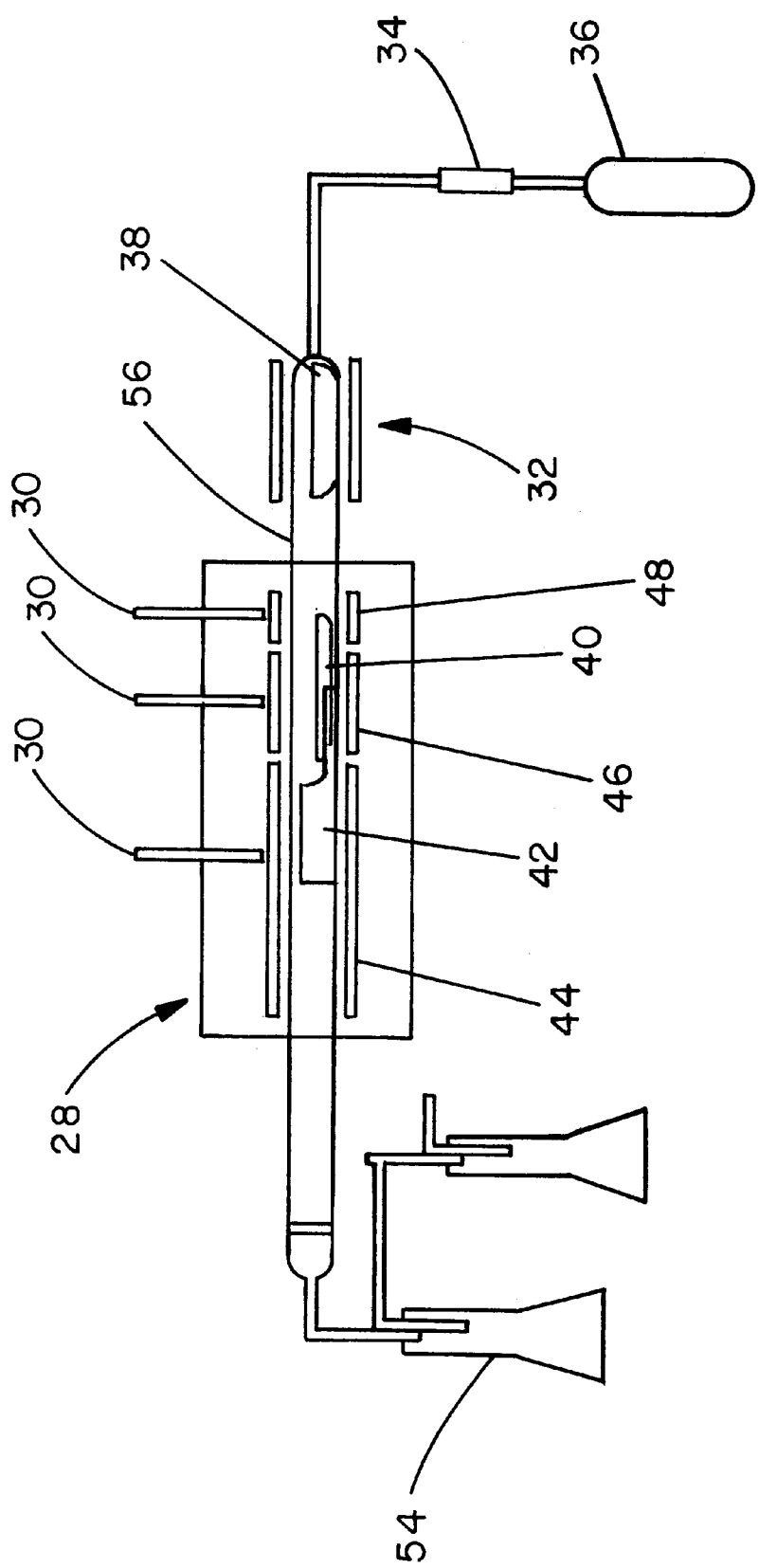
FIG. 2 illustrates by partial schematic a device for the forming of M-nitride material wherein the ammonium chloride is heated by a separate heating source than the molten metal.

2. Referring to FIG. 2, a reaction container 56 containing the M-nitride metals located in a furnace 28 at a reaction temperature while the ammonium chloride containment chamber is located separately and heated independent of the furnace in a sublimation heater 32. In this process, the reaction container 56 and halide containment chambers remain stationary. Reaction rate and desired density of the products can be controlled by this external heating method of the ammonium chloride. Additional modifications to this process may employ the use of an additional carrier agent such as nitrogen, a nitrogen/hydrogen mix or other suitable gas, and diluting the halide reactant by introducing additional carrier gas downstream from the halide containment area but upstream from the reaction area by the external carrier gas source 36 as controlled by gas control 34. A substrate holder 42 is placed downstream of the metal source 40. A reaction by-product recovery means 54 is located on the end of the container 56 opposite to the ammonium halide source 38. A plurality of thermocouples 30 monitor the temperatures in the heating zones as established by heaters 44, 46 and 48.

Figure 3:
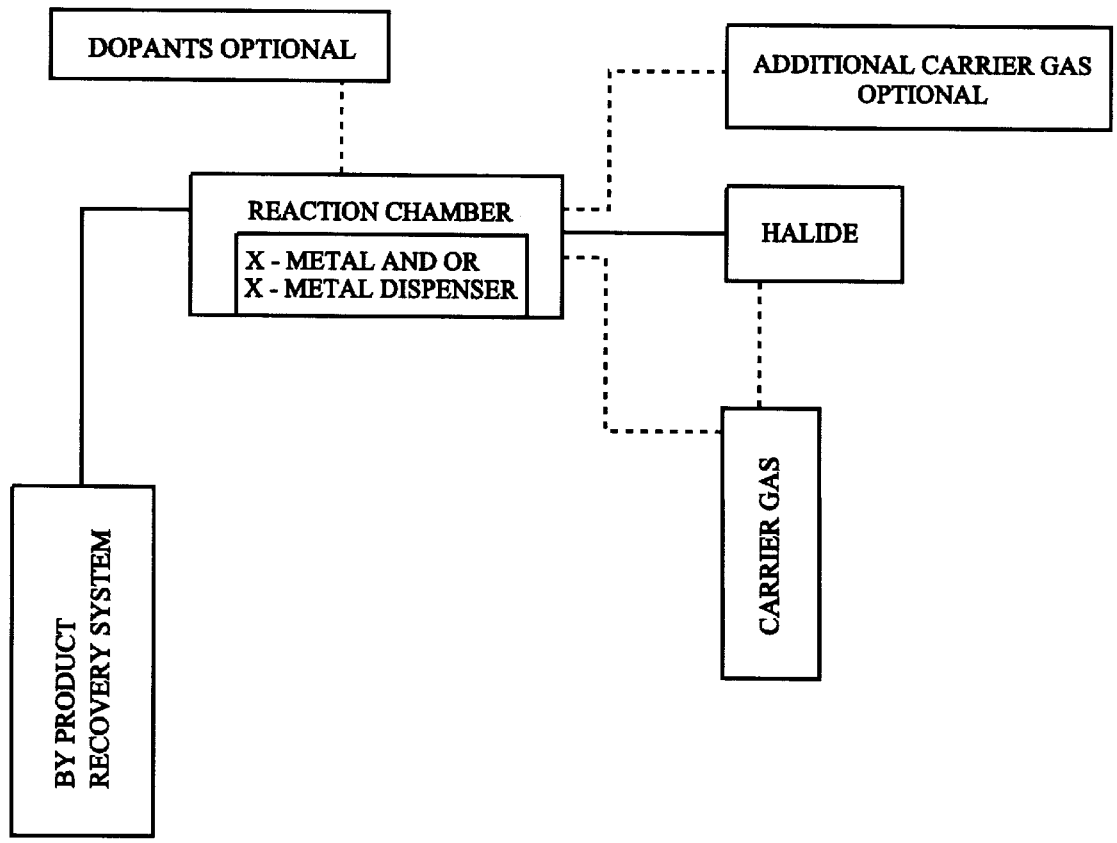
FIG. 3 illustrates by partial schematic block diagram of a system for the forming of M-nitride materials

3. FIG. 3 represents some configurations of reaction chambers and possible alternative methods for introducing additional reactant/carrier gases doping materials and/or gases.

Thirty years ago, the first single crystalline GaN was grown by halide vapor phase epitaxy (HVPE). The growth system relied on gallium chloride (GaCl) and ammonia as reactants (see H. P. Maruska and J. J. Tietjen, Applied Physics Letters, 15 (1969) 327). However, the GaN crystals grown by this system suffered from high stresses due to the lattice mismatch between the sapphire substrate and the GaN epitaxial layer. After thirty years, the problem of lattice mismatch is still an obstacle for growth of single crystal M-nitrides. The new system has several advantages over the state of the art.

1. Direct synthesis of M-nitride from the pure X metal. The new method starts with pure metal/metals/metal alloys and an ammonium halide to synthesize high purity M-nitride material.
2. Combining synthesis and crystal growth into one process using solid starting materials. The new method uses solid starting materials to synthesize and grow crystals of M-nitride in the same operation.
3. Simplicity of setup. The operation is much safer than the HVPE system, which uses GaCl and ammonia, both toxic substances.
4. Safety of operation. The setup consists of a fused silica ampule loaded with solid ammonium halide and a metal such as gallium or indium.
5. Multiple forms of reaction products. The new system can be used either to deposit high density polycrystal M-nitrides on any suitable substrate, or thin and thick films of M-nitrides, or to grow a free-standing M-nitride single crystal. The high density polycrystal material can be used as a target for processes such as PLD or a ceramic heat sink, and the single crystallites can be used as substrates for epitaxial thin film growth.

The invention can be adapted to a closed system, a quasi-open system, or a fully open system. The closed system uses a sealed ampule, and is therefore limited to a small amount of metal source material. The quasi-open system is described above, and is not limited by the amount of metal; however, the time duration is limited to a few hours. The open system is capable of producing large amounts of M-nitride material, and it can run for several days.

Clearly many modifications and variations of the present invention are possible in light of the above teachings and it is therefore understood, that within the inventive scope of the inventive concept, that the invention may be practiced otherwise than specifically claimed.

What is claimed is:

1. A process for forming crystalline metal-nitride material comprising,
   a) heating a metal substance in a first vessel to at least the melting point of said substance,
   b) heating ammonium halide in a second vessel until it sublimes and emits a reactant gas,
   c) flowing said reactant gas into contact with said metal to form M-nitride and
   d) depositing said M-nitride on or across a support member so as to form or grow crystalline M-nitride.
2. A process as defined in claim 1 wherein the ammonium halide compound is selected from the group consisting of ammonium chloride, ammonium bromide and ammonium iodide.
3. A process as defined in claim 1 wherein the aluminum halide is placed within a reaction vessel and then the reaction vessel is translated into a heating zone to cause sublimation.
4. A process as defined in claim 1 wherein the aluminum halide is placed within a reaction vessel and a first heating zone is positioned about said reaction vessel.
5. A process as defined in claim 3 further including a means for allowing the removal of expanding gases is attached to the reaction vessel.
6. A process as defined in claim 5 wherein said means for allowing the removal is an expandable flexible membrane attached to the reaction vessel.
7. A process as defined in claim 1 wherein the metal in the metal substance is selected from the group consisting of gallium, aluminum, indium, germanium and ternary combinations of these including alloys.
8. A process as defined in claim 1 wherein the metal is gallium.
9. A process as defined in claim 1 wherein the reaction product is selected from the group consisting of high purity M-nitride crystalline powder, a high density M-nitride deposited layer on a substrate, either as a polycrystalline layer or a single crystal material, a single crystal of M-nitride material or a layer of M-nitride material.
10. A process as defined in claim 1 further including the introduction of an additional gas agent.
11. A process as defined in claim 10 wherein said additional gas agent is ammonia.
12. The process of claim 1 wherein said reactant gases contact molten metal in a flow tube to form M-nitride, which deposits as a single crystal or a layer of crystals on a substrate downstream from said first vessel or deposits as crystals on the surface of the heated or molten metal substance, forming a bridge or crust across the top of said first vessel.
13. A layer of crystalline M-nitride, either mono or polycrystalline, made by the process of claim 1.
14. A process as defined in claim 1 further including a substrate for said material, said material select from the group consisting of sapphire, lithium gallium oxide, silicon carbide or zinc oxide.
15. M-nitride material, made according to the process of claim 1, to form crystalline M-nitride material, at least a portion of said material being converted into a crystalline powder.
16. An apparatus for making M-nitride crystalline materials, said apparatus comprising:
   one or more vessels or zones that contain sources of reactant gases derived from ammonium halides;
   at least one vessel for containing at least one metal;
   means for heating said vessel;
   means for allowing reactant gases to interact with said metal to create M-nitride materials in a reaction zone;
   means of controlling temperatures and temperature profiles of said vessel; and a material holder, said material holder being positioned within said reaction zone.

17. An apparatus for making M-nitride crystalline material, said apparatus comprising:

a reaction container, said reaction container fitting into and through at least one heating zone, said reaction container being sealed at one end;

means for allowing gas by-materials to escape from said reaction container attached to said reaction container;

a furnace having at least two heating zones, a first heating zone for sublimation of ammonium halide and a second heating zone for controlling the temperature of the metal source and;

means for monitoring and controlling the temperature in the zones; said reaction container having a heating vessel for metal and a heating vessel for ammonium halide; said ammonium halide being heated in a first zone and said metal being heated in a second zone to at least its melting point so that an ammonium halide reactant gas reacts with said metal.

18. An apparatus as defined in 17 further including means for inputting an external gas, said means for external gas being attached to the ammonium halide source end opposite to said means for recovery.

19. An apparatus for making M-nitride crystalline materials, said apparatus comprising:

a furnace having at least one heating zone for controlling the temperature of a metal source;

means for sublimation of ammonium halide, said means for sublimation being positioned outside said furnace, said means for sublimation having a heating zone;

means for monitoring and controlling the temperatures in the heating zones;

a reaction container, said reaction container fitting into and through the heating zones;

means for external carrier gas, said means for external gas being attached to the sublimation zone;

means for allowing gas by-materials to escape from said reaction container attached to the reaction container;

a substrate holder, said substrate holder positioned within said reaction container; said reaction container having a heating vessel for metal and a heating vessel for ammonium halide, said metal being heated in said heating zone to at least its melting point, said ammonium halide being heated in said heating zone to sublimation.

* * * * *